US008593894B2

(12) United States Patent
Arai

(10) Patent No.: US 8,593,894 B2
(45) Date of Patent: Nov. 26, 2013

(54) SEMICONDUCTOR MEMORY DEVICE HAVING FUSE ELEMENTS PROGRAMMED BY IRRADIATION WITH LASER BEAM

(75) Inventor: Tetsuya Arai, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 167 days.

(21) Appl. No.: 13/100,736

(22) Filed: May 4, 2011

(65) Prior Publication Data

US 2011/0292752 A1 Dec. 1, 2011

(30) Foreign Application Priority Data

May 26, 2010 (JP) ................................. 2010-120082

(51) Int. Cl.
*G11C 29/00* (2006.01)
*G11C 17/18* (2006.01)
*G11C 8/00* (2006.01)

(52) U.S. Cl.
USPC .................... 365/200; 365/225.7; 365/230.03

(58) Field of Classification Search
USPC .................. 365/106, 118, 200, 225.7, 230.03
See application file for complete search history.

(56) References Cited

U.S. PATENT DOCUMENTS

| 5,808,944 | A  | * | 9/1998  | Yoshitake et al. | 365/200   |
|-----------|----|---|---------|------------------|-----------|
| 5,970,001 | A  | * | 10/1999 | Noda et al.      | 365/200   |
| 6,639,858 | B2 | * | 10/2003 | Kinoshita et al. | 365/200   |
| 6,963,511 | B2 | * | 11/2005 | Ashizawa         | 365/200   |
| 7,075,848 | B2 | * | 7/2006  | Choi et al.      | 365/225.7 |
| 7,643,361 | B2 | * | 1/2010  | Yoon             | 365/200   |
| 7,835,206 | B2 | * | 11/2010 | Nishioka         | 365/200   |
| 8,208,324 | B2 | * | 6/2012  | Mochida et al.   | 365/200   |
| 8,270,237 | B2 | * | 9/2012  | Kubouchi         | 365/200   |

FOREIGN PATENT DOCUMENTS

JP 2008-71407 3/2008
JP 2008-186847 8/2008

* cited by examiner

*Primary Examiner* — Trong Phan
(74) *Attorney, Agent, or Firm* — Morrison & Foerster LLP

(57) ABSTRACT

A relief-address control unit of a semiconductor memory device includes a fuse storage unit and a relief circuit. The fuse storage unit includes a plurality of fuse elements that are made nonconductive by irradiation with a laser beam, and a protective film with an opening directly above the fuse elements to facilitate the laser beam to pass through. The relief circuit specifies a relieved address based on a nonconductive state of the fuse elements. The opening is in a unified form along a long-side direction of the fuse storage unit. Further, the relief circuit is arranged adjacent to a short-side end of the fuse storage unit.

15 Claims, 9 Drawing Sheets

SEMICONDUCTOR MEMORY DEVICE HAVING FUSE ELEMENTS PROGRAMMED BY IRRADIATION WITH LASER BEAM

BACKGROUND OF THE INVENTION

1. Field of the Invention

The present invention relates to a semiconductor memory device, and more particularly relates to a semiconductor memory device having a function of access control on a relieved address.

2. Description of Related Art

With an increase in a memory capacity of semiconductor memory devices such as DRAM (Dynamic Random Access Memory), there is also an accompanying increase in the number of memory cells that do not function properly (hereinafter, "defective cells"). Therefore, in anticipation of generation of defective cells, auxiliary memory cells known as redundant cells are provided in semiconductor memory devices. Memory addresses of defective cells are relieved by switching memory addresses of the defective cells to memory addresses of the redundant cells. The address of the defective cell that should be relieved is called "relieved address" in the following explanations. Detection of the defective cells and switching of memory addresses of the defective cells to the memory addresses of the redundant cells is performed in a wafer state during manufacturing of semiconductor memory devices. Specifically, defective cells are detected in an operation test performed in the wafer state, and if defective cells are detected, then their relieved addresses are programmed in a relieved address memory area provided in the semiconductor memory device. When the relieved address is a target of access, the target is changed to the redundant cell associated with the relieved address.

Nonvolatile memory elements in the form of fuse elements are often used for holding relieved addresses. The fuse elements are electrically conductive in their initial state, but are changed to a nonconductive state (an insulated state) due to path blockage caused by irradiation with a laser beam. Information equivalent to 1 bit is expressed according to the conductive/nonconductive state of the fuse element. Therefore, by selectively irradiating a plurality of the fuse elements with the laser beam, desired addresses can be recorded in a nonvolatile manner. The process of recording these relieved addresses is normally called "trimming" or "programming". Semiconductor memory device having nonvolatile memory elements to store relieved addresses are described in Japanese Patent Application Laid-Open No. 2008-071407 and No. 2008-186847.

After a wiring process, a principal surface of a semiconductor chip is covered with a protective film called a passivation film. After covering, an operation test is performed to detect the defective cells and then the trimming is performed. To facilitate the trimming, openings are provided in advance on the passivation film positioned over fuse elements. The laser beam is irradiated on the fuse elements through these openings. A relief circuit arranged adjacent to a fuse element group reads the state (bit) of the fuse elements to specify the relieved address.

When providing a plural of openings, a certain margin must be provided between the openings. If this margin area is large, the number of the fuse elements that can be packed in a unit surface area (hereinafter, "integration density") drops. Larger but fewer openings are preferable to smaller and more openings, because this configuration leads to an increased integration efficiency.

Furthermore, the relieved address is read out from the fuse element by the relief circuit, and supplied to a memory bank as a relief address signal. It is important to keep a signal path of the relief address signal simple to increase a transmission speed of the relief address signal.

SUMMARY

In one embodiment, there is provided a semiconductor memory device comprising: a fuse storage unit that includes a plurality of fuse elements that can be programmed by irradiation with a laser beam, and a protective film that covers a semiconductor substrate and has an opening through which the laser beam passes; and a relief circuit that processes a hit signal that is activated when a request is made to access a relieved address held in the fuse elements, wherein the relief circuit is arranged adjacent to at least either a first or a second or both short-side ends of the fuse storage unit, and no other fuse storage unit allocated to the relief circuit is arranged on the opposite side of the relief circuit.

In another embodiment, there is provided a semiconductor memory device comprising: first and second fuse storage units arranged with long sides thereof adjacent to each other; a first relief circuit arranged at one short-side ends of both the first and second fuse storage units; and a second relief circuit arranged at opposite short-side ends of both the first and second fuse storage units, wherein each of the first and second fuse storage units includes a plurality of fuse elements that can be programmed by irradiation with a laser beam, and a protective film that covers a semiconductor substrate and has an opening through which the laser beam passes, and each of the first and second relief circuits processes a hit signal that is activated when a request is made to access a relieved address held in the fuse elements.

According to the present invention, an integration density of fuse elements can be increased, and a transmission speed of a relief address signal can be also increased.

BRIEF DESCRIPTION OF THE DRAWINGS

The above features and advantages of the present invention will be more apparent from the following description of certain preferred embodiments taken in conjunction with the accompanying drawings, in which:

FIG. 3 is a sectional side view of the fuse storage unit 118a;

DETAILED DESCRIPTION OF THE EMBODIMENTS

Preferred embodiments of the present invention will be explained below in detail with reference to the accompanying drawings.

Figure 1:
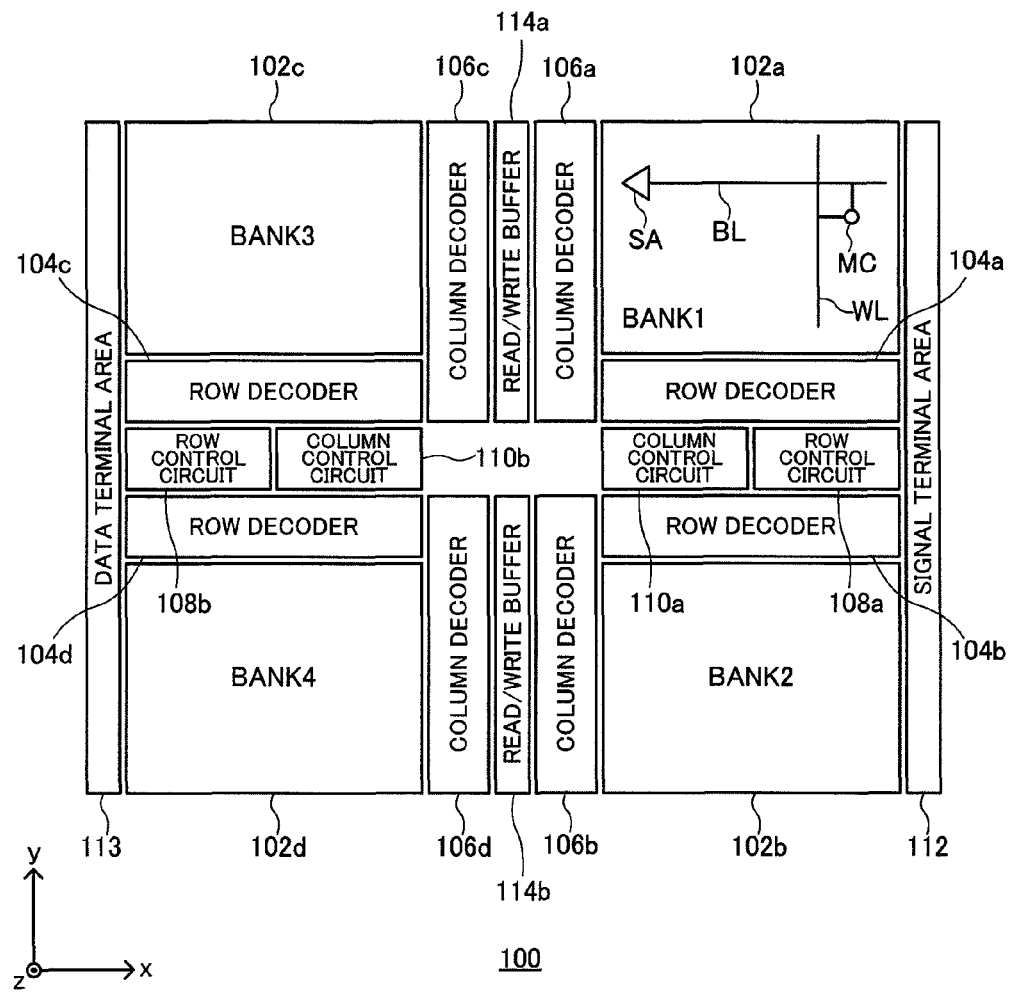
FIG. 1 is a plan layout view of a semiconductor memory device.

FIG. 1 is a plan layout view of a semiconductor memory device 100. The semiconductor memory device 100 according to an embodiment of the present invention is a DDR (Double Data Rate) SDRAM (Synchronous Dynamic Random Access Memory). In FIG. 1, the rightward direction represents an x-axis, the upward direction represents a y-axis, and the direction towards the observer represents a z-axis.

Four memory banks 102a to 102d are shown in FIG. 1. Within each memory bank 102, a plurality of word lines WL (along the y direction) and a plurality of bit lines BL (along the x direction) intersect each other. A memory cell MC is arranged at the intersections of these lines. A row decoder 104a is arranged along an x side of the memory bank 102a. Similarly, row decoders 104b, 104c, and 104d are arranged along the x sides of the memory banks 102b, 102c, and 102d, respectively. A column decoder 106a is arranged along a y side of the memory bank 102a. Similarly, column decoders 106b, 106c, and 106d are arranged along the y sides of the memory banks 102b, 102c, and 102d, respectively.

A column control circuit 110a and a row control circuit 108a are arranged side-by-side along the x direction between the row decoders 104a and 104b. The column control circuit 110a and the row control circuit 108a are for both the memory banks 102a and 102b. Similarly, a column control circuit 110b and a row control circuit 108b are arranged side-by-side along the x direction between the row decoders 104c and 104d. The column control circuit 110b and the row control circuit 108b are for both the memory banks 102c and 102d.

A signal terminal area 112 is arranged along the y side of the memory banks 102a and 102b, and a data terminal area 113 is arranged along the y side of the memory banks 102c and 102d. Address terminals, command terminals and the like are arranged in the signal terminal area 112. Data input and output terminals and the like are arranged in the data terminal area 113.

Further, a read/write buffer 114a is arranged between the column decoders 106a and 106c, and a read/write buffer 114b is arranged between the column decoders 106b and 106d. The read/write buffer 114a is allocated for the memory banks 102a and 102c and the read write buffer 114b is allocated for the memory banks 102b and 102d.

While how to control the memory banks 102a and 102b is performed is explained below, the following explanations also basically apply to control of the memory banks 102c and 102d.

Various signals such as address signals and command signals are input into the signal terminal area 112. These signals, after being processed by a main controller (not shown) provided near the signal terminal area 112, are transmitted to the row control circuit 108a and the column control circuit 110a and the like. Among the address signals, row addresses are supplied to the row control circuits 108a and 108b and the row decoders 104a to 104d, and the column addresses are supplied to the column control circuits 110a and 110b and the column decoders 106a to 106d. The address signals also include information for specifying which of the memory banks 102a to 102d is to be accessed.

The row decoder 104a is controlled by the row control circuit 108a to select any one of the word lines WL of the memory bank 102a according to the row address. The row decoder 104b is controlled by the row control circuit 108a to select anyone of the word lines WL of the memory bank 102b according to the row address.

The column decoder 106a is controlled by the column control circuit 110a to select any one of the bit lines BL of the memory bank 102a according to the column address. The selected bit line BL is connected to the read/write buffer 114a via a sense amplifier SA. Thus, data in the target memory cell MC becomes accessible via the data input/output terminal within the data terminal area 113. Similarly, the column decoder 106b is controlled by the column control circuit 110a to select any one of the bit lines BL in the memory bank 102b according to the column address. The selected bit line BL is connected to the read/write buffer 114b via the sense amplifier SA. The data signal amplified by the read/write buffer 114b becomes accessible from the data terminal area 113.

Relieved addresses are programmed in the row control circuits 108a and 108b, and the column control circuits 110a and 110b. Details thereof will be explained later. For example, when an input row address matches a relieved address (address of a defective cell), the row control circuit 108a transmits a relief address signal to the row decoder 104a or 104b. Upon receiving the relief address signal, the row decoder 104 change the address of the defective cell to the address of a redundant cell. Control of the row control circuit 108a is explained below, and the same explanations also apply to the row control circuit 108b as well as the column control circuits 110a and 110b.

Figure 2:
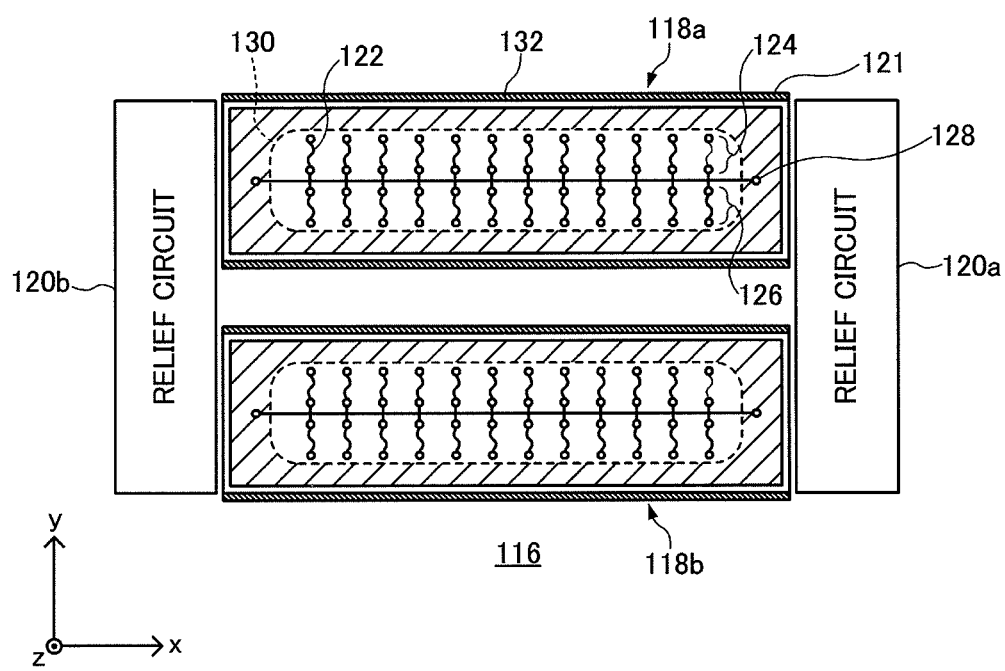
FIG. 2 is a plan layout view of a relief-address control unit according to the present embodiment.

FIG. 2 is a plan layout view of a relief-address control unit 116 according to the present embodiment. The relief-address control unit 116 shown in FIG. 2 is included in the row control circuit 108a. The relief-address control unit 116 includes fuse storage units 118a and 118b that extend along the x direction. The fuse storage units 118a and 118b include a plurality of fuse elements 122 that can be made nonconductive by irradiation with a laser beam. More specifically, the fuse elements 122 are arranged in a first fuse row 124 and in a second fuse row 126 and connected to a ground line 128. An internal circuit 121 is arranged on the long sides of the fuse storage units 118a and 118b. One terminal of each fuse element 122 is connected to the ground line 128 and the other terminal is connected to a latch circuit 138 (explained later) in the internal circuit 121. A gap between two fuse elements 122 depends on the precision of the laser beam.

The desired fuse elements 122 are made nonconductive by irradiating the laser beam along a negative direction of the z axis. Each fuse element 122 corresponds to 1 bit. In the example shown in FIG. 2, the fuse storage unit 118a includes 12 fuse elements 122 each in the first fuse row 124 and the second fuse row 126. Therefore, the fuse storage unit 118a corresponds to 24 bits of information. The fuse storage units 118a and 118b together are capable of storing 48 bits of information.

The fuse storage unit 118a is covered with a passivation film (explained later). An opening 130 is provided in the passivation film directly above the fuse elements 122 to facilitate the laser beam to pass through. The fuse elements 122 are enclosed by a guard ring 132. Relief circuits 120a and 120b are arranged adjacent to the short sides of the fuse storage units 118a and 118b (the y sides). A surface area of the fuse storage units 118a and 118b is markedly greater than that of the relief circuits 120a and 120b; however, for the sake of clarity, relatively larger relief circuits 120a and 120b are shown in FIG. 2.

Only a single fuse storage unit 118 is present along a long-side direction (the x direction), that is, along the horizontal direction on the sheet surface. Therefore, only a single opening 130 is present along the horizontal direction. On the other hand, two fuse storage units 118 are present along a short-side direction (the y direction), that is, the vertical direction on the sheet surface. Therefore, two openings 130 are present along the vertical direction. That is, the number of the fuse storage units 118 can be represented by (x, y)=(1, 2).

The internal circuit 121 detects a conductive state of each fuse element 122. When the relieved address matches the input row address, the relief circuits 120a and 120b transmit the relief address signal to the row decoders 104a and 104b. The relief circuit 120a corresponds to the row decoder 104a and the memory bank 102a, while the relief circuit 120b corresponds to the row decoder 104b and the memory bank 102b.

It is arbitrary how to allocate the fuse elements 122 to the relief circuits 120a and 120b. For example, the fuse elements 122 of the fuse storage unit 118a can be allocated to the relief circuit 120a, and the fuse elements 122 of the fuse storage unit 118b can be allocated to the relief circuit 120b. Alternatively, of the 48 fuse elements 122 in the fuse storage units 118a and 118b together, the 24 fuse elements 122 on the right side of FIG. 2 can be allocated to the relief circuit 120a, and the 24 fuse elements on the left side can be allocated to the relief circuit 120b. The number of the fuse elements 122 for the relief circuits 120a and the number of the fuse elements 122 for the relief circuit 120b does not need to be equal.

Figure 3:
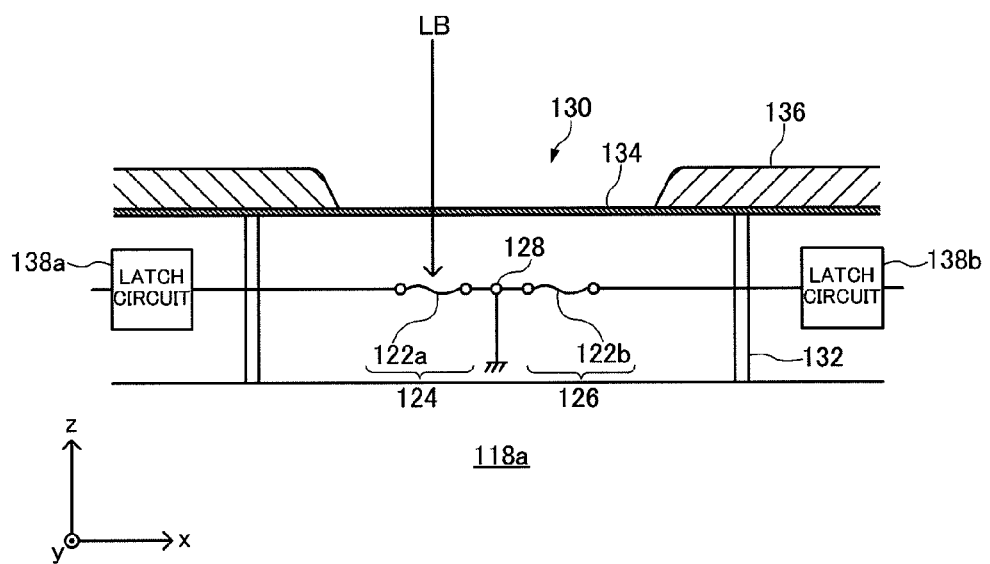

FIG. 3 is a sectional side view of the fuse storage unit 118a. The fuse elements 122 are arranged as explained above inside the fuse storage unit 118a. An external latch circuit 138a is connected to the ground line 128 via a fuse element 122a. Similarly, a latch circuit 138b is connected to the ground line 128 via a fuse element 122b. The latch circuits 138a and 138b detect the conductive/nonconductive state of the fuse elements 122a and 122b, and output binary electrical signals.

The fuse elements 122 are entirely covered with a silicon dioxide film 134. The silicon dioxide film 134 is partly covered with a passivation film 136. That is, the opening 130 is provided in the passivation film 136 directly above the fuse elements 122. The opening 130 is provided so that during irradiation with a laser beam LB, energy of the laser beam LB is not attenuated by the passivation film 136. A certain distance needs to be kept between the opening 130 in the passivation film 136 and the guard ring 132, so that after the formation of the passivation film 136, even if the passivation film 136 shrinks after curing, it still securely covers the guard ring 132.

When irradiated with the laser beam LB through the opening 130, the laser beam LB penetrates the silicon dioxide film 134 to melt the fuse element 122a down. The guard ring 132 provided around the side face of the fuse storage unit 118a protects the adjacent circuits such as the latch circuit 138 from being damaged by the laser beam LB.

Figure 4:
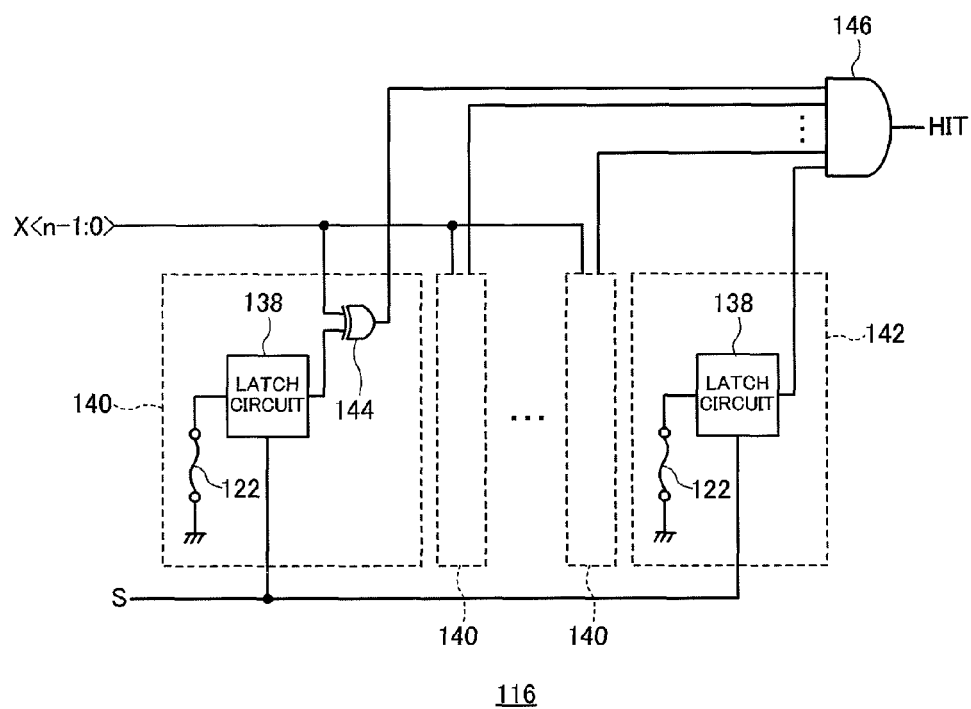
FIG. 4 is a circuit diagram of a determining part for one relieved address bit.

FIG. 4 is a circuit diagram of a determining part for one relieved address bit. FIG. 4 shows a relation between the latch circuit 138 of the internal circuit 121 and the fuse element 122 of the fuse storage unit 118. More specifically, the internal circuit 121 and the fuse storage unit 118 include a plurality of bit determining circuits 140 and a single enable circuit 142. The bit determining circuit 140 includes the fuse element 122, the latch circuit 138, and an XOR circuit 144. There is a corresponding bit determining circuit 140 for each bit of the row address. The row address part of one relieved address (hereinafter, "relieved row address") is stored collectively in the bit determining circuits 140.

The latch circuit 138 detects the state of the fuse element 122 in synchronization with a synchronous signal S. The latch circuit 138 outputs a HIGH signal (a high potential) when the fuse element 122 is nonconductive, and outputs a LOW signal (a ground potential) when the fuse element 122 is conductive. The output of the latch circuit 138 is input into the XOR circuit 144. n bits of a row address X<n−1:0> are also supplied to the XOR circuit 144. The XOR circuit 144 outputs an exclusive OR of information equivalent to 1 bit of the row address X and information equivalent to 1 bit indicated by the state of the fuse element 122 to an AND circuit 146. When the fuse element 122 is conductive (LOW) and the row address bit is 1 (HIGH), the XOR circuit 144 outputs a HIGH signal. When the fuse element 122 is nonconductive (HIGH) and the address bit is 0 (LOW), the XOR circuit 144 outputs a HIGH signal.

When the fuse element 122 in the enable circuit 142 is conductive (LOW), the AND circuit 146 outputs a LOW regardless of a determination result of the bit determining circuit 140. That is, when the relieved row address programmed in all the bit determining circuits 140 completely matches the supplied row address, and when the fuse element 122 in the enable circuit 142 is nonconductive, the AND circuit 146 outputs a HIT signal that is HIGH. The row control circuit 108a determines in this manner whether the row address supplied from outside matches the relieved row address. Such a circuit is provided in the internal circuit 121 for a plurality of addresses.

Figure 5:
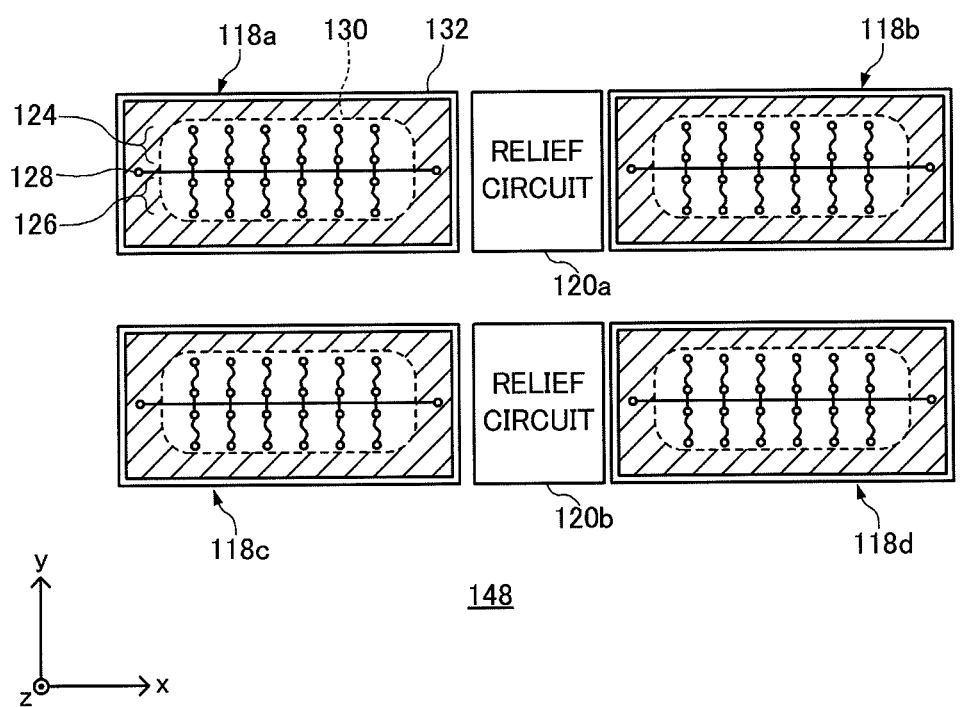
FIG. 5 is a plain layout view of a relief-address control unit according to a first comparative example.

FIG. 5 is a plain layout view of a relief-address control unit 148 according to a first comparative example. In the first comparative example, the relief-address control unit 148 includes fuse storage units 118a, 118b, 118c, and 118d that extend along the x direction. The internal circuit 121 is not shown in FIG. 5 to clarify the relation between the fuse storage unit 118 and the relief circuit 120. The same holds true in FIG. 6. In the first comparative example, there are six fuse elements 122 each in the first fuse row 124 and the second fuse row 126 in the fuse storage unit 118a. That is, the fuse storage unit 118a corresponds to 12 bits of information. The four fuse storage units 118a to 118d together correspond to 48 bits of information.

The fuse storage unit 118a is partly covered with the passivation film. That is, the opening 130 is provided directly above the fuse elements 122 to facilitate the laser beam to pass through. The fuse elements 122 are surrounded by the guard ring 132. The relief circuit 120a is arranged between the fuse storage units 118a and 118b that are arranged along the x direction. Similarly, the relief circuit 120b is arranged between the fuse storage units 118c and 118d. The relief circuit 120a is for the fuse storage units 118a and 118b, and the relief circuit 120b is for the fuse storage units 118c and 118d.

The first comparative example differs from the present embodiment that it has two fuse storage units 118a and 118b arranged along the x axis, that is, along the long-side direction of the relief-address control unit 148. In other words, in the first comparative example, there are two openings 130 of the fuse storage unit 118a and 118b, along the long-side direction. This can be also understood as the opening 130 being split into two due to the presence of the relief circuit 120a. On the other hand, in the relief-address control unit 116 according to the present embodiment shown in FIG. 2, the opening 130 is in a unified form along the long-side direction, meaning that the opening 130 is not split.

As explained above, a certain margin needs to be provided between two openings 130. Furthermore, a certain margin must be also provided between the opening 130 and the guard ring 132. Therefore, the length along the long-side direction (the x direction) tends to be longer in the first comparative example as compared to that in the present embodiment. Thus, there is an advantage that the integration density in the present embodiment is greater than that of the first comparative example.

Figure 6:
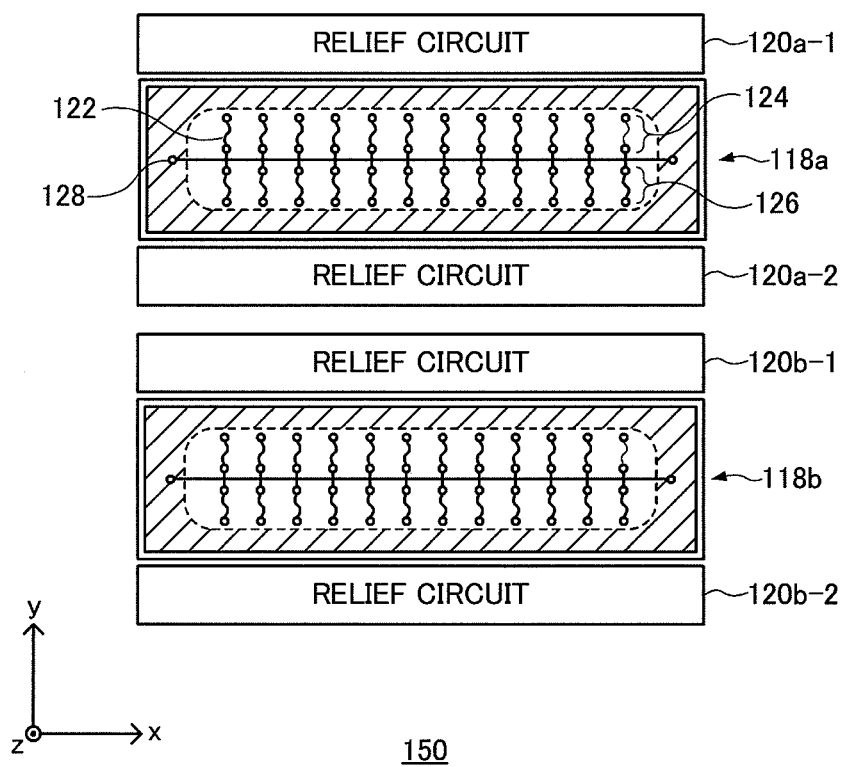
FIG. 6 is a plain layout view of a relief-address control unit according to a second comparative example.

FIG. 6 is a plain layout view of a relief-address control unit 150 according to a second comparative example. In the second comparative example, the relief-address control unit 150 includes the fuse storage units 118a and 118b that extend along the x direction. In the second comparative example, there are 12 fuse elements 122 each in the first fuse row 124 and the second fuse row 126 in the fuse storage unit 118a. That is, the fuse storage unit 118a corresponds to 24 bits of information. The fuse storage units 118a and 118b together correspond to 48 bits of information.

In the second comparative example, relief circuits 120a-1 and 120a-2 are arranged on each long-side end of the fuse storage unit 118a. Similarly, relief circuits 120b-1 and 120b-2 are arranged on each long-side end of the fuse storage unit 118b. The fuse elements 122 in the first fuse row 124 of the fuse storage unit 118a are allocated to the relief circuit 120a-1, and the fuse elements 122 in the second fuse row 126 of the fuse storage unit 118a are allocated to the relief circuit 120a-2.

The second comparative example is common to the present embodiment such that it has a single fuse storage unit 118a arranged along the x axis, that is, along the long-side direction of the relief-address control unit 150. Thus, the opening 130 is in a unified form along the long-side direction. As a result, an integration density that is comparable to that of the present embodiment can be realized in the second comparative example.

However, in the second comparative example, two relief circuits 120a-1 and 120a-2 are provided for one memory bank 102a. Therefore, there is an increase in a length of a path between the separated relief circuits 120a-1 and 120a-2 to send and receive signals. This results in a complex signal wiring, and drop in a transmission speed of the relief address signal. On the other hand, in the layout according to the present embodiment, the signal transmission path is simple, and therefore a high transmission speed of the relief address signal can be easily achieved. The signal wiring is explained below with reference to FIG. 7.

Figure 7:
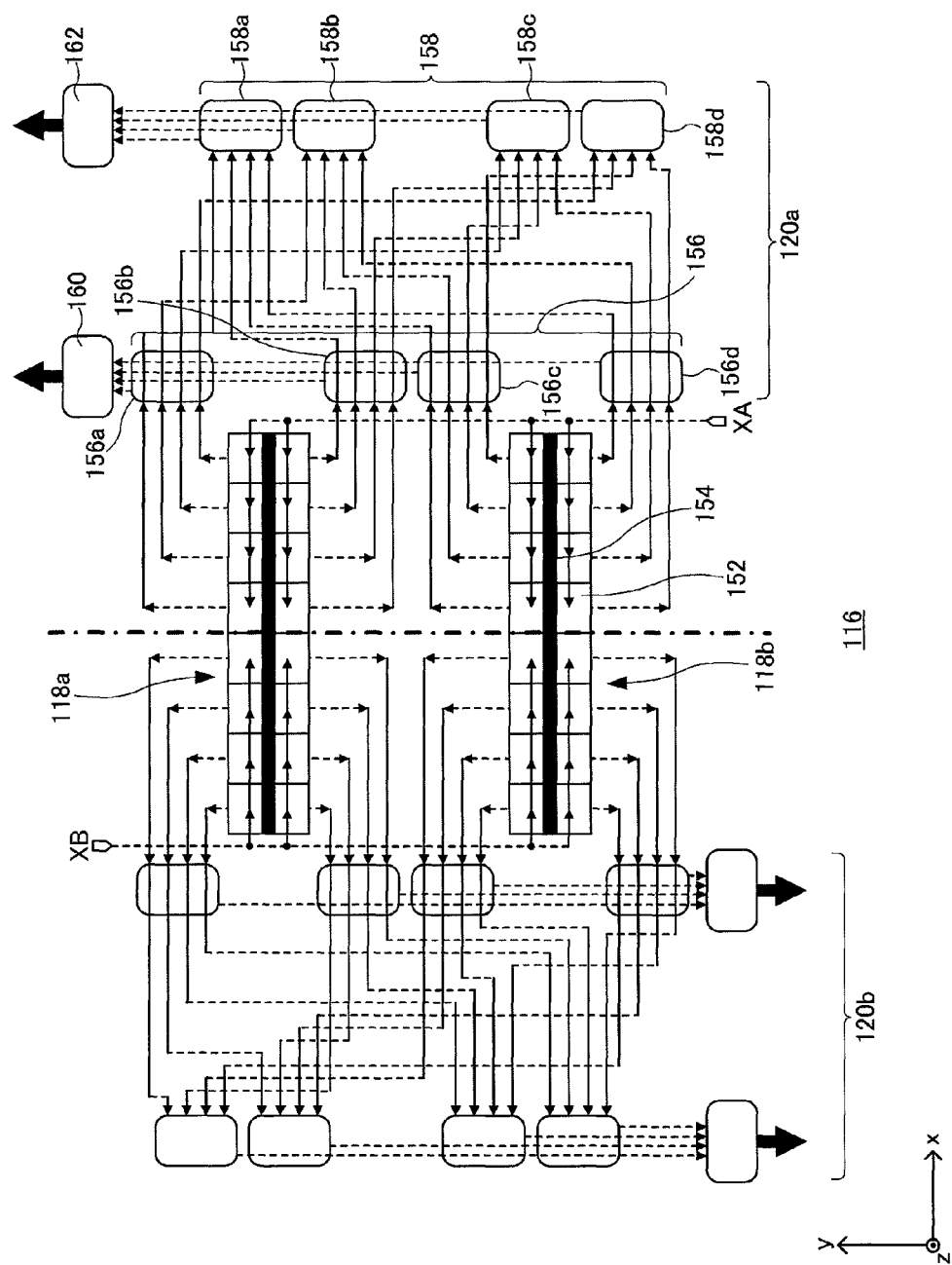
FIG. 7 is a wiring layout diagram of the fuse storage unit and the relief circuit.

FIG. 7 is a wiring layout diagram of the fuse storage unit 118 and the relief circuit 120. The fuse storage unit 118 and the internal circuit 121 include a plurality of relieved address determining units 152. The relieved address determining unit 152 stores a single relieved row address part and an enable bit, as shown in FIG. 4, and determines whether the row address matches the relieved row address. The ground line 128, the first fuse row 124, and the second fuse row 126 together represent a fuse element group 154. In the fuse storage unit 118a of FIG. 7, a total of 16 relieved address determining units 152 capable of storing 16 relieved addresses are arranged in an upper row and a lower row of eight each.

Among the 16 relieved address determining units 152 of the fuse storage unit 118a, eight on the right (first group) correspond to the memory bank 102a, and the other eight on the left (second group) correspond to the memory bank 102b. The relieved address determining units 152 of the fuse storage unit 118b are also similarly divided. In this way, in the 32 relieved address determining units 152 of the fuse storage units 118a and 118b, 16 on the right are allocated to the memory bank 102a and the other 16 on the left are allocated to the memory bank 102b. Row addresses XA that are meant for the memory bank 102a are supplied to the 16 relieved address determining units 152 on the right, and row addresses XB that are meant for the memory bank 102b are supplied to the 16 relieved address determining units 152 on the left.

Figure 9:
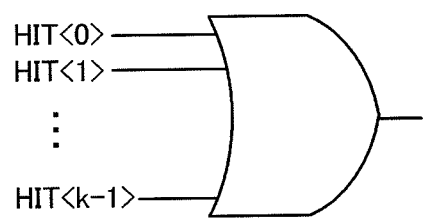
FIG. 9 is a circuit diagram of OR gate included in encoders.

Each relieved address determining unit 152 outputs a HIT signal that is HIGH when the relieved row address held by the relieved address determining unit 152 itself matches the row address supplied from a signal terminal area 112a. The HIT signal group is supplied to a first encoder 156 and a second encoder 158. The HIT signal group supplied to the first encoder 156 is aggregated by a third encoder 160, and the HIT signal group supplied to the second encoder 158 is aggregated by a fourth encoder 162. The first encoder 156, the second encoder 158 1 the third encoder 160, and the fourth encoder 162 shown on the right side in FIG. 7 correspond to the relief circuit 120a of FIG. 2. These encoders are made of OR gate circuits, into which HIT<0>, HIT<1> to HIT<k−1> are inputted, as shown in FIG. 9.

The first encoder 156 aggregates the HIT signals that have the same high-order bits in the row address. For example, encoders 156a to 156d activate an output of those signals when high-order bits of the row addresses are 00, 01, 10, or 11, regardless of the low-order bits of the row addresses. Thus, circuit parts of the row decoder 104a that operate based on the high-order bits of the row addresses can be controlled.

The second encoder 158 aggregates the HIT signals that have the same low-order bits in the row address. For example, encoders 158a to 158d activate an output of those signals when low-order bits of the row addresses are 00, 01, 10, or 11, regardless of the high-order bits of the row addresses. With this configuration, circuit parts of the row decoder 104a that operate based on the low-order bits of the row addresses can be controlled.

Further, an output from the third encoder 160 or an output from the fourth encoder 162 is supplied to those circuit parts of the row decoder 104a that need to be aware of the fact that there is a hit irrespective of what the address is.

In this manner, the high-order bits of the relieved row address are specified from the HIT signal group supplied to the third encoder 160, and the low-order bits of the relieved row address are specified from the HIT signal group supplied to the fourth encoder 162. In this way, the target address in the memory bank 102a is specified. As shown in FIG. 7, the relief circuit 120a has a layout in which the signal that proceeds mainly along the x direction (the right direction) is processed by the first encoder 156 and the second encoder 158, and the encoded signal obtained as a result proceeds mainly along the y direction (the upward direction). On the other hand, the relief circuit 120b has a layout in which the signal that proceeds mainly along the x direction (the left direction) is processed by the first encoder 156 and the second encoder 158, and the encoded signal obtained as a result proceeds mainly along the y direction (the downward direction). Thus, this kind of signal wiring facilitates a faster access with no waste in the flow of the signals. Furthermore, designing is also made easier with designing required for only one relief circuit 120a. By rotating design data of the relief circuit 120a by 180 degrees, the same result can be achieved even without having to separately design the relief circuit 120b.

Figure 8:
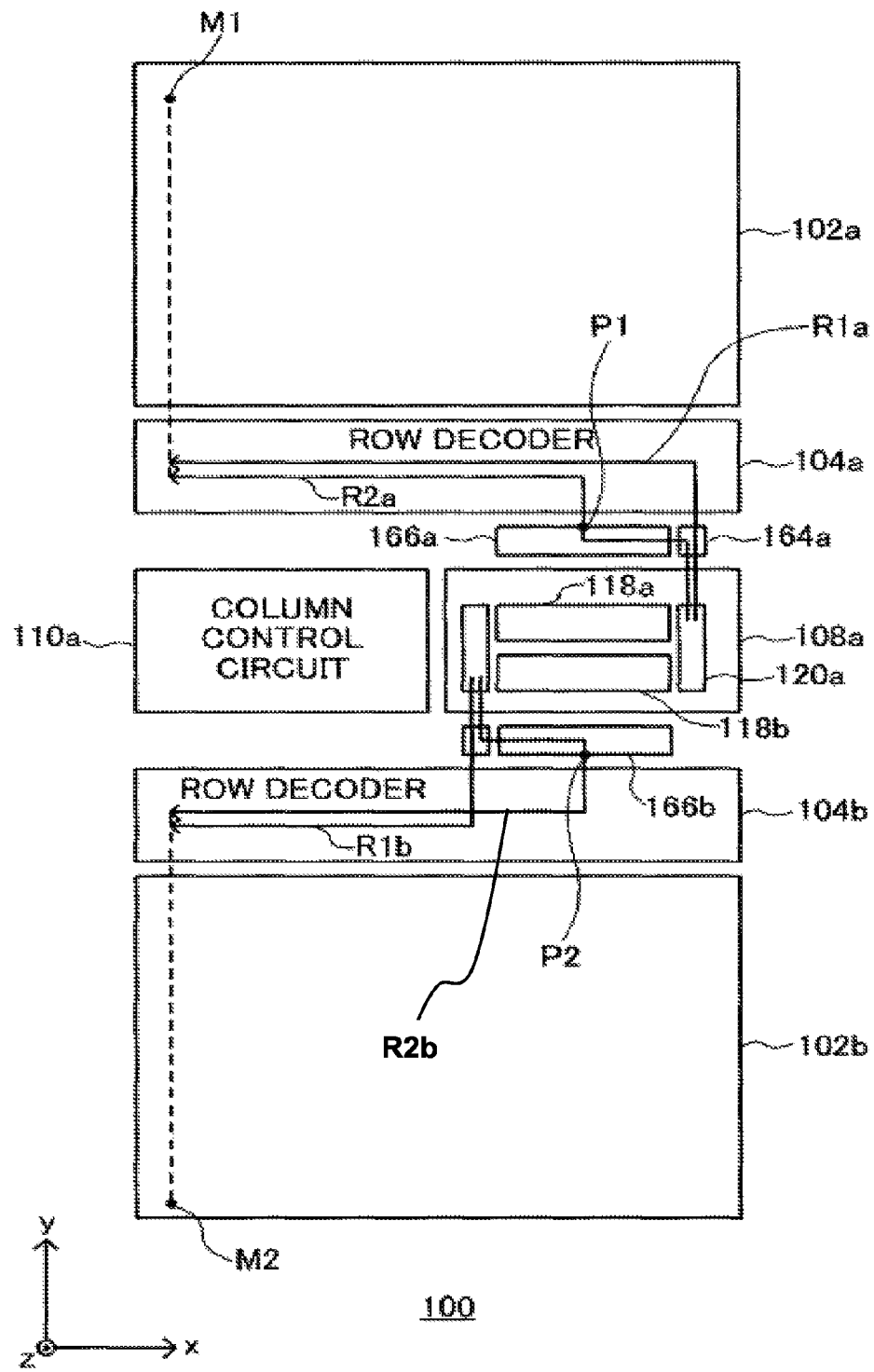
FIG. 8 shows a memory access path according to the present embodiment.

FIG. 8 shows a memory access path according to the present embodiment. The relief address signal output by the relief circuit 120a is buffered by a pre-buffer 164a after which it is supplied to a final-buffer 166a, and is supplied to the row decoder 104a from a first output position P1. The first output position P1 is provided at a center of the long side of the fuse storage unit 118a. A pre-buffer 164b and a final-buffer 166b are provided for the relief circuit 120b also. The relief address signal supplied to the final-buffer 166b is supplied to the row decoder 104b from a second output position P2. The second output position P2 is provided at a center of the long side of the fuse storage unit 118b. The signal paths are modified so that instead of being supplied directly from the relief circuits 120a and 120b to the row decoders 104a and 104b, the relief address signals are supplied from the first output position P1 and the second output position P2.

As to how a memory cell M1, which is the farthest memory cell in the memory bank 102a from the relief circuit 120a, is accessed is explained below. A memory cell corresponding to the memory cell M1 of the memory bank 102a in the memory bank 102b is a memory cell M2. When the signal path is an access route R1a as in the case when the relief circuit 120a supplies the relief address signal directly to the row decoder 104a without passing through the first output position P1, the signal transmission path within the row decoder 104a is the longest. That is, because in the wiring running substantially the entire length of the long side of the row decoder 104a, in this case the right-hand end is an input terminal and the left-hand end is an output terminal, the delay in the signal is the maximum. On the other hand, when the signal path is an access route R1b as in the case when the relief circuit 120b supplies the relief address signal directly to the row decoder 104b without passing through the second output position P2, the signal transmission path within the row decoder 104b will be shorter than that of the access route R1a. That is, a memory access time becomes different according to which of the memory banks 102a and 102b, in which the memory cells M1 and M2, respectively, are in symmetrical positions, is accessed.

On the other hand, in an access route R2a, which is the signal path when the relief circuit 120a supplies the relief address signal by passing through the first output position P1, and an access route R2b, which is the signal path when the relief circuit 120b supplies the relief address signal by passing through the second output position P2, the signal transmission paths are of the same length. Therefore, fluctuations arising in the signal path length depending on which memory bank 102 is accessed can be prevented. When the access routes R2a and R2b are compared with the access routes R1a and R1b, respectively, the access of the memory bank 102a with the access route R2a is faster than with the access route R1a, but slower with the access route R2b than with the access route R1b. However, because the specifications of a semiconductor memory device are defined according to the slowest access case, specifications can be improved by improving the worst case.

The first output position P1 and the second output position P2 do not necessarily need to be at the center of the long sides of the fuse storage units 118a and 118b, respectively, but can be provided at positions that are symmetrical in relation to the long-side direction (the x direction) of the fuse storage units 118a and 118b, respectively.

The semiconductor memory device 100 has been explained based on the above embodiment. In the semiconductor memory device 100 according to the above embodiment, the unified opening 130 is provided along the long-side direction of the fuse storage unit 118. Accordingly, the integration density of the fuse elements 122 can be increased. Furthermore, because the relief circuits 120 are arranged at the short-side ends of the fuse storage unit 118, the signal path used for the relieved address control is made simple, thereby maintaining faster access. In addition, the first output position P1 and the second output position P2 are provided at positions that are symmetrical in relation to the X axis, and thus fluctuations in the access time depending on which memory bank 102 is accessed are prevented.

While exemplary embodiments have been explained above, these embodiments are only illustrative, and it should be clear to persons skilled in the art that various changes and modifications can be made within the scope of the claims of the present invention, and that these changes and modifications are also included the scope of the claims of the invention. Therefore, the descriptions and the drawings in the present specification should be considered as illustrative and not restrictive.

What is claimed is:

1. A semiconductor memory device comprising:
a fuse storage unit that includes a plurality of laser fuse elements, and a protective film that covers a semiconductor substrate and has an opening; and
a relief circuit that processes a hit signal that is activated when a request is made to access a relieved address held in the fuse elements, wherein
the relief circuit is arranged adjacent to at least either a first or a second or both short-side ends of the fuse storage unit, and
no other fuse storage unit associated to the relief circuit is arranged on the opposite side of the relief circuit.

2. The semiconductor memory device as claimed in claim 1, wherein
the relief circuit includes first and second relief circuits,
the first relief circuit is arranged adjacent to the first short-side end of the fuse storage unit, and
the second relief circuit is arranged adjacent to the second short-side end of the fuse storage unit.

3. The semiconductor memory device as claimed in claim 2, wherein
the fuse elements are divided into a first group that is close to the first short-side end and a second group that is close to the second short-side end,
the first relief circuit processes the hit signal that is activated when a request is made to access a relieved address held in fuse elements belonging to the first group, and
the second relief circuit processes the hit signal that is activated when a request is made to access a relieved address held in fuse elements belonging to the second group.

4. The semiconductor memory device as claimed in claim 2, further comprising:
a first memory bank provided along a first long-side end of the fuse storage unit; and
a second memory bank provided along a second long-side end of the fuse storage unit,
wherein the first and second relief circuits are associated to the first and second memory banks, respectively.

5. The semiconductor memory device as claimed in claim 4, wherein
the first relief circuit supplies a first relief address signal to the first memory bank from a first output position provided on the first long-side end of the fuse storage unit,
the second relief circuit supplies a second relief address signal to the second memory bank from a second output position provided on the second long-side end of the fuse storage unit, and
the first and second output positions are arranged substantially symmetrically in view of a long-side direction of the fuse storage unit.

6. A semiconductor memory device comprising:
first and second fuse storage units arranged with long sides thereof adjacent to each other;
a first relief circuit arranged at one short-side ends of both the first and second fuse storage units; and
a second relief circuit arranged at opposite short-side ends of both the first and second fuse storage units, wherein
each of the first and second fuse storage units includes a plurality of laser fuse elements, and a protective film that covers a semiconductor substrate and has an opening, and
each of the first and second relief circuits processes a hit signal that is activated when a request is made to access a relieved address held in the fuse elements.

7. The semiconductor memory device as claimed in claim 6, wherein
the fuse elements included in the first fuse storage unit are divided into a first group that is close to the first relief circuit and a second group that is close to the second relief circuit,
the fuse elements included in the second fuse storage unit are divided into a third group that is close to the first relief circuit and a fourth group that is close to the second relief circuit,
the first relief circuit is associated to fuse elements belonging to the first and third groups, and
the second relief circuit is associated to fuse elements belonging to the second and fourth groups.

8. The semiconductor memory device as claimed in claim 6, wherein
the first relief circuit is associated to fuse elements in the first fuse storage unit, and
the second relief circuit is associated to fuse elements in the second fuse storage unit.

9. The semiconductor memory device as claimed in claim 6, further comprising first and second memory banks that sandwich the first and second fuse storage units, wherein each of output signals of the first and second relief circuits is supplied to the first and second memory banks, respectively.

10. The semiconductor memory device as claimed in claim 6, wherein no other fuse storage unit associated to the first relief circuit is arranged on the opposite side of the first relief circuit.

11. The semiconductor memory device as claimed in claim 10, wherein no other fuse storage unit associated to the second relief circuit is arranged on the opposite side of the second relief circuit.

12. The semiconductor memory device as claimed in claim 1, wherein the plurality of laser fuse elements can be programmed by irradiation with a laser beam.

13. The semiconductor memory device as claimed in claim 12, wherein the opening is provided to pass through the laser beam.

14. The semiconductor memory device as claimed in claim 6, wherein the plurality of laser fuse elements can be programmed by irradiation with a laser beam.

15. The semiconductor memory device as claimed in claim 14, wherein the opening is provided to pass through the laser beam.

* * * * *